(12) United States Patent
Gilton

(10) Patent No.: US 6,809,362 B2
(45) Date of Patent: Oct. 26, 2004

(54) MULTIPLE DATA STATE MEMORY CELL

(75) Inventor: Terry L. Gilton, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/081,594

(22) Filed: Feb. 20, 2002

(65) Prior Publication Data

US 2003/0156452 A1 Aug. 21, 2003

(51) Int. Cl.$^7$ ............................................. H01L 27/108
(52) U.S. Cl. ............................. 257/296; 257/2; 257/3; 257/5; 365/100; 365/148; 365/163
(58) Field of Search ................................ 257/1, 2, 3, 4, 257/5, 289

(56) References Cited

U.S. PATENT DOCUMENTS

| | | |
|---|---|---|
| 3,271,591 A | 9/1966 | Ovshinsky |
| 3,622,319 A | 11/1971 | Sharp |
| 3,743,847 A | 7/1973 | Boland |
| 3,961,314 A | 6/1976 | Klose et al. |
| 3,966,317 A | 6/1976 | Wacks et al. |
| 3,983,542 A | 9/1976 | Ovshinsky |
| 3,988,720 A | 10/1976 | Ovshinsky |
| 4,177,474 A | 12/1979 | Ovshinsky |
| 4,267,261 A | 5/1981 | Hallman et al. |
| 4,269,935 A | 5/1981 | Masters et al. |
| 4,312,938 A | 1/1982 | Drexler et al. |
| 4,316,946 A | 2/1982 | Masters et al. |
| 4,320,191 A | 3/1982 | Yoshikawa et al. |
| 4,405,710 A | 9/1983 | Balasubramanyam et al. |
| 4,419,421 A | 12/1983 | Wichelhaus et al. |
| 4,499,557 A | 2/1985 | Holmberg et al. |
| 4,597,162 A | 7/1986 | Johnson et al. |
| 4,608,296 A | 8/1986 | Keem et al. |
| 4,637,895 A | 1/1987 | Ovshinsky et al. |
| 4,646,266 A | 2/1987 | Ovshinsky et al. |
| 4,664,939 A | 5/1987 | Ovshinsky |
| 4,668,968 A | 5/1987 | Ovshinsky et al. |
| 4,670,763 A | 6/1987 | Ovshinsky et al. |
| 4,671,618 A | 6/1987 | Wu et al. |

(List continued on next page.)

FOREIGN PATENT DOCUMENTS

| | | |
|---|---|---|
| JP | 56126916 | 10/1981 |
| WO | WO 97/48032 | 12/1997 |
| WO | WO 99/28914 | 6/1999 |
| WO | WO 00/48196 | 8/2000 |
| WO | WO 02/21542 | 3/2002 |

OTHER PUBLICATIONS

Abdel–All, A.; Elshafie,A.; Elhawary, M.M., DC electric–field effect in bulk and thin–film Ge5As38Te57 chalcogenide glass, Vacuum 59 (2000) 845–853.

Adler, D.; Moss, S.C., Amorphous memories and bistable switches, J. Vac. Sci. Technol. 9 (1972) 1182–1189.

Adler, D.; Henisch, H.K.; Mott, S.N., The mechanism of threshold switching in amorphous alloys, Rev. Mod. Phys. 50 (1978) 209–220.

(List continued on next page.)

*Primary Examiner*—David Nelms
*Assistant Examiner*—Mai-Huong Tran
(74) *Attorney, Agent, or Firm*—Dickstein Shapiro Morin & Oshinsky LLP

(57) ABSTRACT

A programmable multiple data state memory cell including a first electrode layer formed from a first conductive material, a second electrode layer formed from a second conductive material, and a first layer of a metal-doped chalcogenide material disposed between the first and second electrode layers. The first layer providing a medium in which a conductive growth can be formed to electrically couple together the first and second electrode layers. The memory cell further includes a third electrode layer formed from a third conductive material, and a second layer of a metal-doped chalcogenide material disposed between the second and third electrode layers, the second layer providing a medium in which a conductive growth can be formed to electrically couple together the second and third electrode layers.

34 Claims, 4 Drawing Sheets

U.S. PATENT DOCUMENTS

| | | |
|---|---|---|
| 4,673,957 A | 6/1987 | Ovshinsky et al. |
| 4,678,679 A | 7/1987 | Ovshinsky |
| 4,696,758 A | 9/1987 | Ovshinsky et al. |
| 4,698,234 A | 10/1987 | Ovshinsky et al. |
| 4,710,899 A | 12/1987 | Young et al. |
| 4,728,406 A | 3/1988 | Banerjee et al. |
| 4,737,379 A | 4/1988 | Hudgens et al. |
| 4,766,471 A | 8/1988 | Ovshinsky et al. |
| 4,769,338 A | 9/1988 | Ovshinsky et al. |
| 4,775,425 A | 10/1988 | Guha et al. |
| 4,788,594 A | 11/1988 | Ovshinsky et al. |
| 4,795,657 A | 1/1989 | Formigoni et al. |
| 4,800,526 A | 1/1989 | Lewis |
| 4,809,044 A | 2/1989 | Pryor et al. |
| 4,818,717 A | 4/1989 | Johnson et al. |
| 4,843,443 A | 6/1989 | Ovshinsky et al. |
| 4,845,533 A | 7/1989 | Pryor et al. |
| 4,847,674 A | 7/1989 | Sliwa et al. |
| 4,853,785 A | 8/1989 | Ovshinsky et al. |
| 4,891,330 A | 1/1990 | Guha et al. |
| 5,128,099 A | 7/1992 | Strand et al. |
| 5,159,661 A | 10/1992 | Ovshinsky et al. |
| 5,166,758 A | 11/1992 | Ovshinsky et al. |
| 5,177,567 A | 1/1993 | Klersy et al. |
| 5,219,788 A | 6/1993 | Abernathey et al. |
| 5,238,862 A | 8/1993 | Blalock et al. |
| 5,272,359 A | 12/1993 | Nagasubramanian et al. |
| 5,296,716 A | 3/1994 | Ovshinsky et al. ............ 257/3 |
| 5,314,772 A | 5/1994 | Kozicki |
| 5,315,131 A | 5/1994 | Kishimoto et al. |
| 5,335,219 A | 8/1994 | Ovshinsky et al. |
| 5,341,328 A | 8/1994 | Ovshinsky et al. |
| 5,350,484 A | 9/1994 | Gardner et al. |
| 5,359,205 A | 10/1994 | Ovshinsky |
| 5,360,981 A | 11/1994 | Owen et al. |
| 5,406,509 A | 4/1995 | Ovshinsky et al. |
| 5,414,271 A | 5/1995 | Ovshinsky et al. |
| 5,500,532 A | 3/1996 | Kozicki et al. |
| 5,512,328 A | 4/1996 | Yoshimura et al. |
| 5,512,773 A | 4/1996 | Wolf et al. |
| 5,534,711 A | 7/1996 | Ovshinsky et al. |
| 5,534,712 A | 7/1996 | Ovshinsky et al. |
| 5,536,947 A | 7/1996 | Klersy et al. |
| 5,543,737 A | 8/1996 | Ovshinsky |
| 5,591,501 A | 1/1997 | Ovshinsky et al. |
| 5,596,522 A | 1/1997 | Ovshinsky et al. |
| 5,612,691 A | 3/1997 | Murmann et al. |
| 5,687,112 A | 11/1997 | Ovshinsky .................. 365/163 |
| 5,694,054 A | 12/1997 | Ovshinsky et al. |
| 5,714,768 A | 2/1998 | Ovshinsky et al. |
| 5,726,083 A | 3/1998 | Takaishi |
| 5,751,012 A | 5/1998 | Wolstenholme et al. |
| 5,761,115 A | 6/1998 | Kozicki et al. ............. 365/182 |
| 5,789,277 A | 8/1998 | Zahorik et al. |
| 5,825,046 A | 10/1998 | Czubatyj et al. |
| 5,841,150 A | 11/1998 | Gonzalez et al. |
| 5,846,889 A | 12/1998 | Harbison et al. |
| 5,869,843 A | 2/1999 | Harshfield ..................... 257/5 |
| 5,896,312 A | 4/1999 | Kozicki et al. ............. 365/153 |
| 5,912,839 A | 6/1999 | Ovshinsky et al. .... 365/185.03 |
| 5,914,893 A | 6/1999 | Kozicki et al. ............. 365/107 |
| 5,920,788 A | 7/1999 | Reinberg |
| 5,933,365 A | 8/1999 | Klersy et al. |
| 5,998,066 A | 12/1999 | Block et al. |
| 6,011,757 A | 1/2000 | Ovshinsky |
| 6,072,716 A | 6/2000 | Jacobson et al. |
| 6,077,729 A | 6/2000 | Harshfield |
| 6,084,796 A | 7/2000 | Kozicki et al. ............. 365/153 |
| 6,087,674 A | 7/2000 | Ovshinsky et al. |
| 6,117,720 A | 9/2000 | Harshfield |
| 6,141,241 A | 10/2000 | Ovshinsky et al. |
| 6,143,604 A | 11/2000 | Chiang et al. |
| 6,150,253 A | 11/2000 | Doan et al. ................. 438/597 |
| 6,177,338 B1 | 1/2001 | Liaw et al. |
| 6,236,059 B1 | 5/2001 | Wolstenholme et al. |
| RE37,259 E | 7/2001 | Ovshinsky |
| 6,297,170 B1 | 10/2001 | Gabriel et al. |
| 6,300,684 B1 | 10/2001 | Gonzalez et al. |
| 6,316,784 B1 | 11/2001 | Zahorik et al. |
| 6,329,606 B1 | 12/2001 | Freyman et al. |
| 6,339,544 B1 | 1/2002 | Chiang et al. |
| 6,348,365 B1 | 2/2002 | Moore et al. |
| 6,350,679 B1 | 2/2002 | McDaniel et al. |
| 6,376,284 B1 | 4/2002 | Gonzalez et al. |
| 6,388,324 B2 | 5/2002 | Kozicki et al. |
| 6,391,688 B1 | 5/2002 | Gonzalez et al. |
| 6,404,665 B1 | 6/2002 | Lowery et al. |
| 6,414,376 B1 | 7/2002 | Thakur et al. |
| 6,418,049 B1 | 7/2002 | Kozicki et al. |
| 6,423,628 B1 | 7/2002 | Li et al. |
| 6,429,064 B1 | 8/2002 | Wicker |
| 6,437,383 B1 | 8/2002 | Xu |
| 6,462,984 B1 | 10/2002 | Xu et al. |
| 6,469,364 B1 | 10/2002 | Kozicki |
| 6,473,332 B1 | 10/2002 | Ignatiev et al. |
| 6,480,438 B1 | 11/2002 | Park |
| 6,487,106 B1 | 11/2002 | Kozicki |
| 6,487,113 B1 | 11/2002 | Park et al. |
| 6,501,111 B1 | 12/2002 | Lowrey |
| 6,507,061 B1 | 1/2003 | Hudgens et al. |
| 6,511,862 B2 | 1/2003 | Hudgens et al. |
| 6,511,867 B2 | 1/2003 | Lowery et al. |
| 6,512,241 B1 | 1/2003 | Lai |
| 6,514,805 B2 | 2/2003 | Xu et al. |
| 6,531,373 B2 | 3/2003 | Gill et al. |
| 6,534,781 B2 | 3/2003 | Dennison |
| 6,545,287 B2 * | 4/2003 | Chiang ........................ 257/3 |
| 6,545,907 B1 | 4/2003 | Lowery et al. |
| 6,555,860 B2 | 4/2003 | Lowery et al. |
| 6,563,164 B2 | 5/2003 | Lowery et al. |
| 6,566,700 B2 | 5/2003 | Xu |
| 6,567,293 B1 | 5/2003 | Lowery et al. |
| 6,569,705 B2 | 5/2003 | Chiang et al. |
| 6,570,784 B2 | 5/2003 | Lowery |
| 6,576,921 B2 | 6/2003 | Lowery |
| 6,586,761 B2 | 7/2003 | Lowrey |
| 6,589,714 B2 | 7/2003 | Maimon et al. |
| 6,590,807 B2 | 7/2003 | Lowery |
| 6,593,176 B2 | 7/2003 | Dennison |
| 6,597,009 B2 | 7/2003 | Wicker |
| 6,605,527 B2 | 8/2003 | Dennison et al. |
| 6,613,604 B2 | 9/2003 | Maimon et al. |
| 6,621,095 B2 | 9/2003 | Chiang et al. |
| 6,625,054 B2 | 9/2003 | Lowery et al. |
| 6,642,102 B2 | 11/2003 | Xu |
| 6,646,297 B2 | 11/2003 | Dennison |
| 6,649,928 B2 | 11/2003 | Dennison |
| 6,667,900 B2 | 12/2003 | Lowery et al. |
| 6,671,710 B2 | 12/2003 | Ovshinsky et al. |
| 6,673,700 B2 | 1/2004 | Dennison et al. |
| 6,674,115 B2 | 1/2004 | Hudgens et al. |
| 6,687,153 B2 | 2/2004 | Lowery |
| 6,687,427 B2 | 2/2004 | Ramalingam et al. |
| 6,690,026 B2 | 2/2004 | Peterson |
| 6,696,355 B2 | 2/2004 | Dennison |
| 6,707,712 B2 | 3/2004 | Lowery |
| 6,714,954 B2 | 3/2004 | Ovshinsky et al. |
| 2002/0000666 A1 | 1/2002 | Kozicki et al. |
| 2002/0072188 A1 | 6/2002 | Gilton |
| 2002/0106849 A1 | 8/2002 | Moore |
| 2002/0123169 A1 | 9/2002 | Moore et al. |

| | | |
|---|---|---|
| 2002/0123170 A1 | 9/2002 | Moore et al. |
| 2002/0123248 A1 | 9/2002 | Moore et al. |
| 2002/0127886 A1 | 9/2002 | Moore et al. |
| 2002/0163828 A1 | 11/2002 | Krieger et al. |
| 2002/0168820 A1 | 11/2002 | Kozicki et al. |
| 2002/0190350 A1 | 12/2002 | Kozicki |
| 2003/0001229 A1 | 1/2003 | Moore et al. |
| 2003/0027416 A1 | 2/2003 | Moore |
| 2003/0035314 A1 | 2/2003 | Kozicki |
| 2003/0035315 A1 | 2/2003 | Kozicki |
| 2003/0048519 A1 | 3/2003 | Kozicki |
| 2003/0048744 A1 | 3/2003 | Ovshinsky et al. |
| 2003/0107105 A1 | 6/2003 | Kozicki |
| 2003/0137869 A1 | 7/2003 | Kozicki |
| 2003/0156447 A1 | 8/2003 | Kozicki |
| 2003/0209728 A1 | 11/2003 | Kozicki et al. |
| 2003/0209971 A1 | 11/2003 | Kozicki et al. |
| 2003/0210564 A1 | 11/2003 | Kozicki et al. |
| 2003/0212724 A1 | 11/2003 | Ovshinsky et al. |
| 2003/0212725 A1 | 11/2003 | Ovshinsky et al. |
| 2004/0035401 A1 | 2/2004 | Ramachandran et al. |

OTHER PUBLICATIONS

Afifi, M.A.; Labib, H.H.; El–Fazary, M.H.; Fadel, M., Electrical and thermal properties of chalcogenide glass system Se75Ge25–xSbx, Appl. Phys. A 55 (1992) 167–169.

Afifi, M.A.; Labib, H.H.; Fouad, S.S.; El–Shazly, A.A., Electrical & thermal conductivity of the amorphous semiconductor GexSe1–x, Egypt, J. Phys. 17 (1986) 335–342.

Alekperova, Sh.M.; Gadzhieva, G.S., Current–Voltage characteristics of Ag2Se single crystal near the phase transition, Inorganic Materials 23 (1987) 137–139.

Aleksiejunas, A.; Cesnys, A., Switching phenomenon and memory effect in thin–film heterojunction of polycrystalline selenium–silver selenide, Phys. Stat. Sol. (a) 19 (1973) K169–K171.

Angell, C.A., Mobile ions in amorphous solids, Annu. Rev. Phys. Chem. 43 (1992) 693–717.

Aniya, M., Average electronegativity, medium–range–order, and ionic conductivity in superionic glasses, Solid state Ionics 136–137 (2000) 1085–1089.

Asahara, Y.; Izumitani, T., Voltage controlled switching in Cu–As–Se compositions, J. Non–Cryst. Solids 11 (1972) 97–104.

Asokan, S.; Prasad, M.V.N.; Parthasarathy, G.; Gopal, E.S.R., Mechanical and chemical thresholds in IV–VI chalcogenide glasses, Phys. Rev. Lett. 62 (1989) 808–810.

Baranovskii, S.D.; Cordes, H., On the conduction mechanism in ionic glasses, J. Chem. Phys. 111 (1999) 7546–7557.

Belin, R.; Taillades, G.; Pradel, A.; Ribes, M., Ion dynamics in superionic chalcogenide glasses: complete conductivity spectra, Solid state Ionics 136–137 (2000) 1025–1029.

Belin, R.; Zerouale, A.; Pradel, A.; Ribes, M., Ion dynamics in the argyrodite compound Ag7GeSe5I: non–Arrhenius behavior and complete conductivity spectra, Solid State Ionics 143 (2001) 445–455.

Benmore, C.J.; Salmon, P.S., Structure of fast ion conducting and semiconducting glassy chalcogenide alloys, Phys. Rev. Lett. 73 (1994) 264–267.

Bernede, J.C., Influence du metal des electrodes sur les caracteristiques courant–tension des structures M–Ag2Se–M, Thin solid films 70 (1980) L1–L4.

Bernede, J.C., Polarized memory switching in MIS thin films, Thin Solid Films 81 (1981) 155–160.

Bernede, J.C., Switching and silver movements in Ag2Se thin films, Phys. Stat. Sol. (a) 57 (1980) K101–K104.

Bernede, J.C.; Abachi, T., Differential negative resistance in metal/insulator/metal structures with an upper bilayer electrode, Thin solid films 131 (1985) L61–L64.

Bernede, J.C.; Conan, A.; Fousenan't, E.; El Bouchairi, B.; Goureaux, G., Polarized memory switching effects in Ag2Se/Se/M thin film sandwiches, Thin solid films 97 (1982) 165–171.

Bernede, J.C.; Khelil, A.; Kettaf, M.; Conan, A., Transition from S– to N–type differential negative resistance in Al–Al2O3–Ag2–xSe1+x thin film structures, Phys. Stat. Sol. (a) 74 (1982) 217–224.

Bondarev, V.N.; Pikhitsa, P.V., A dendrite model of current instability in RgAg4I5, Solid State Ionics 70/71 (1994) 72–76.

Boolchand, P., The maximum in glass transition temperature (Tg) near x=1/3 in GexSe1–x Glasses, Asian Journal of Physics (2000) 9, 709–72.

Boolchand, P.; Bresser, W.J., Mobile silver ions and glass formation in solid electrolytes, Nature 410 (2001) 1070–1073.

Boolchand, P.; Georgiev, D.G.; Goodman, B., Discovery of the Intermediate Phase in Chalcogenide Glasses, J. Optoelectronics and Advanced Materials, 3 (2001), 703.

Boolchand, P.; Selvanathan, D.; Wang, Y.; Georgiev, D.G.; Bresser, W.J., Onset of rigidity in steps in chalcogenide glasses, Properties and Applications of Amorphous Materials, M.F. Thorpe and Tichy, L. (eds.) Kluwer Academic Publishers, the Netherlands, 2001, pp. 97–132.

Boolchand, P.; Enzweiler, R.N.; Tenhover, M., Structural ordering of evaporated amorphous chalcogenide alloy films: role of thermal annealing, Diffusion and Defect Data vol. 53–54 (1987) 415–420.

Boolchand, P.; Grothaus, J.; Bresser, W.J.; Suranyi, P., Structural origin of broken chemical order in a GeSe2 glass, Phys. Rev. B 25 (1982) 2975–2978.

Boolchand, P.; Grothaus, J.; Phillips, J.C., Broken chemical order and phase separation in GexSe1–x glasses, Solid state comm. 45 (1983) 183–185.

Boolchand, P., Bresser, W.J., Compositional trends in glass transition temperature (Tg), network connectivity and nanoscale chemical phase separation in chalcogenides, Dept. of ECECS, Univ. Cincinnati (Oct. 28, 1999) 45221–0030.

Boolchand, P.; Grothaus, J, Molecular Structure of Melt–Quenched GeSe2 and GeS2 glasses compared, Proc. Int. Conf. Phys. Semicond. (Eds. Chadi and Harrison) 17$^{th}$ (1985) 833–36.

Bresser, W.; Boolchand, P.; Suranyi, P., Rigidiy percolation and molecular clustering in network glasses, Phys. Rev. Lett. 56 (1986) 2493–2496.

Bresser, W.J.; Boolchand, P.; Suranyi, P.; de Neufville, J.P, Intrinsically broken chalcogen chemical order in stoichiometric glasses, Journal de Physique 42 (1981) C4–193–C4–196.

Bresser, W.J.; Boolchand, P.; Suranyi, P.; Hernandez, J.G., Molecular phase separation and cluster size in GeSe2 glass, Hyperfind Interactions 27 (1986) 389–392.

Cahen, D.; Gilet, J.–M.; Schmitz, C.; Chernyak, L.; Gartsman, K.; Jakubowicz, A., Room–Temperature, electric field induced creation of stable devices in CuInSe2 Crystals, Science 258 (1992) 271–274.

Chatterjee, R.; Asokan, S.; Titus, S.S.K., Current–controlled negative–resistance behavior and memory switching in bulk As–Te–Se glasses, J. Phys. D: Appl. Phys. 27 (1994) 2624–2672.

Chen, C.H.; Tai, K.L. , Whisker growth induced by Ag photodoping in glassy GexSe1-x films, Appl. Phys. Lett. 37 (1980) 1075–1077.

Chen, G.; Cheng, J., Role of nitrogen in the crystallization of silicon nitride–doped chalcogenide glasses, J. Am. Ceram. Soc. 82 (1999) 2934–2936.

Chen, G.; Cheng, J.; Chen, W., Effect of Si3N4 on chemicall durability of chalcogenide glass, J. Non–Cryst. Solids 220 (1997) 249–253.

Cohen, M.H.; Neale, R.G.; Paskin, A., A model for an amorphous semiconductor memory device, J. Non–Cryst. Solids 8–10 (1972) 885–891.

Croitoru, N.; Lazarescu, M.; Popescu, C.; Telnic, M.; and Vescan, L., Ohmic and non–ohmic conduction in some amorphous semiconductors, J. Non–Cryst. Solids 8–10 (1972) 781–786.

Dalven, R.; Gill, R., Electrical properties of beta–Ag2Te and beta–Ag2Se from 4.2 to 300K, J. Appl. Phys. 38 (1967) 753–756.

Davis, E.A., Semiconductors without form, Search 1 (1970) 152–155.

Dearnaley, G.; Stoneham, A.M.; Morgan, D.V., Electrical phenomena in amorphous oxide films, Rep. Prog. Phys. 33 (1970) 1129–1191.

Dejus, R.J.; Susman, S.; Volin, K.J.; Montague, D.G.; Price, D.L., Structure of Vitreous Ag–Ge–Se, J. Non–Cryst. Solids 143 (1992) 162–180.

den Boer, W., Threshold switching in hydrogenated amorphous silicon, Appl. Phys. Lett. 40 (1982) 812–813.

Drusedau, T.P.; Panckow, A.N.; Klabunde, F., The hydrogenated amorphous silicon/nanodisperse metal (SIMAL) system–Films of unique electronic properties, J. Non–Cryst. Solids 198–200 (1996) 829–832.

El Bouchairi, B.; Bernede, J.C.; Burgaud, P., Propeties of Ag2-xSe1+x/n-Si diodes, Thin Solid Films 110 (1983) 107–113.

El Gharras, Z.; Bourahla, A.; Vautier, C., Role of Photoinduced defects in amorphous GexSe1-x photoconductivity, J. Non–Cryst. Solids 155 (1993) 171–179.

El Ghrandi, R.; Calas, J.; Galibert, G.; Averous, M., Silver photodissolution in amorphous chalcogenide thin films, Thin Solid Films 218 (1992)259–273.

El Ghrandi, R.; Calas, J.; Galibert, G., Ag dissolution kinetics in amorphous GeSe5.5 thin films from "in–situ" resistance measurements vs time, Phys. Stat. Sol. (a) 123 (1991) 451–460.

El-kady, U.L., The threshold switching in semiconducting glass Ge21Se17Te62, Indian J. Phys. 70a (1996) 507–516.

Elliott, S.R., A unified mechanism for metal photodissolution in amorphous chalcogenide materials, J. Non–Cryst. Solids 130 (1991) 85–97.

Elliott, S.R., Photodissolution of metals in chalcogenide glasses: A Unified mechanism, J. Non–Cryst. Solids 137–138 (1991) 1031–1034.

Elsamanoudy, M.M.; Hegab, N.A.; Fadel, M., Conduction mechanism in the pre–switching state of thin films containing Te As Ge Si, Vacuum 46 (1995) 701–707.

El-Zahed, H.; El-Korashy, A., Influence of composition on the electrical and optical properties of Ge20BixSe80-x films, Thin Solid Films 376 (2000) 236–240.

Fadel, M., Switching phenomenon in evaporated Se–Ge–As thin films of amorphous chalcogenide glass, Vacuum 44 (1993) 851–855.

Fadel, M.; El-Shari, H.T., Electrical, thermal and optical properties of Se75Ge7Sb18, Vacuum 43 (1992) 253–257.

Feng, X. ;Bresser, W.J.; Boolchand, P., Directed evidence for stiffness threshold in Chalcogenide glasses, Phys. Rev. Lett. 78 (1997) 4422–4425.

Feng, X.; Bresser, W.J.; Zhang, M.; Goodman, B.; Boolchand, P., Role of network connectivity on the elastic, plastic and thermal behavior of covalent glasses, J. Non–Cryst. Solids 222 (1997) 137–143.

Fischer–Colbrie, A.; Bienenstock, A.; Fuoss, P.H.; Marcus, M.A., Structure and bonding in photodiffused amorphous Ag–GeSe2 thin films, Phys. Rev. B 38 (1988) 12388–12403.

Fleury, G.; Hamou, A.; Viger, C.; Vautier, C., Conductivity and crystallization of amorphous selenium, Phys. Stat. Sol. (a) 64 (1981) 311–316.

Fritzsche, H, Optical and electrical energy gaps in amorphous semiconductors, J. Non–Cryst. Solids 6 (1971) 49–71.

Fritzsche, H., Electronic phenomena in amorphous semiconductors, Annual Review of Materials Science 2 (1972) 697–744.

Gates, B.; Wu, Y.; Yin, Y.; Yang, P.; Xia, Y., Single–crystalline nanowires of Ag2Se can be synthesized by templating against nanowires of trigonal Se, J. Am. Chem. Soc. (2001) curently ASAP.

Gosain, D.P.; Nakamura, M.; Shimizu, T.; Suzuki, M.; Okano, S., Nonvolatile memory based on reversible phase transition phenomena in telluride glasses, Jap. J. Appl. Phys 28 (1989) 1013–1018.

Guin, J.–P.; Rouxel, T.; Keryvin, V.; Sangleboeuf, J.–C.; Serre, I.; Lucas, J., Indentation creep of Ge–Se chalcogenide glasses below Tg: elastic recovery and non–Newtonian flow, J. Non Cryst. Solids 298 (2002) 260–269.

Guin, J.–P.; Rouxel, T.; Sangleboeuf, J.–C; Melscoet, I.; Lucas, J., Hardness, toughness and scratchability of germanium–selenium chalcogenide glasses, J. Am. Ceram. Soc. 85 (2002) 1545–52.

Gupta, Y.P., On electrical switching and memory effects in amorphous chalcogenides, J. Non–Cryst. Sol. 3 (1970) 148–154.

Haberland, D.R.; Stiegler, H., New experiments on the charge–controlled switching effect in amorphous semiconductors, J. Non–Cryst. Solids 8–10 (1972) 408–414.

Haifz, M.M.; Ibrahim, M.M.; Dongol, M.; Hammad, F.H., Effect of composition on the strucure and electrical properties of As–Se–Cu glasses, J. Apply. Phys. 54 (1983) 1950–1954.

Hajto, J.; Rose, M.J.; Osborne, I.S.; Snell, A.J.; Le Comber, P.G.; Owen A.E. Quantization effects in metal/a–Si:H/metal devices, Int. J. Electronics 73 (1992) 911–913.

Hajto, J.; Hu, J.; Snell, A.J.; Turvey, K.; Rose, M., DC and AC measurements on metal/a–Si:H/metal room temperature quantised resistance devices, J. Non–Cryst. Solids 266–269 (2000) 1058–1061.

Hajto, J.; McAuley, B.; Snell, A.J.; Owen, A.E., Theory of room temperature quantized resistance effects in metal-a–Si:H–metal thin film structuress, J. Non–Cryst. Solids 198–200 (1996) 825–828.

Hajto, J.; Owen, A.E.; Snell, A.J.; Le Comber, P.G.; Rose, M.J., Analogue memory and ballistic electron effects in metal–amorphous silicon structures, Phil. Mag. B 63 (1991) 349–369.

Hayashi, T.; Ono, Y.; Fukaya, M.; Kan, H., Polarized memory switching in amorphous Se film, Japan. J. Appl. Phys 13 (1974) 1163–1164.

Hegab, N.A.; Fadel, M.; Sedeek, K., Memory switching pehnomena in thin films of chalcogenide semiconductors, Vacuum 45 (1994) 459–462.

Hirose, Y.; Hirose, H., Polarity–dependent memory switching and behavior of Ag dendrite in Ag–photodoped amorphous As2S3 films, J. Appl. Phys. 47 (1976) 2767–2772.

Hong, K.S.; Speyer, R.F., Switching behavior in II–IV–V2 amorphous semiconductor systems, J. Non–Cryst. Solids 116 (1990) 191–200.

Hosokawa, S., Atomic and electronic structures of glassy GexSe1-x around the stiffness threshold composition, J. Optoelectroncis and Advanced Materials 3 (2001) 199–214.

Hu, J.; Snell, A.J.; Hajto, J.; Owen, A.E., Constant current forming in Cr/p+a-/Si:H/V thin film devices, J. Non–Cryst. Solids 227–230 (1998) 1187–1191.

Hu, J.; Hajto, J.; Snell, A.J.; Owen, A.E.; Rose, M.J., Capacitance anomaly near the metal–non–metal transition in Cr–hydrogenated amorphous Si–V thin–film devices, Phil. Mag. B. 74 (1996) 37–50.

Hu, J.; Snell, A.J.; Hajto, J.; Owen, A.E., Current–induced instability in Cr–p+a–Si:H–V thin film devices, Phil. Mag. B80 (2000) 29–43.

Iizima, S.; Sugi, M.; Kikuchi, M.; Tanaka, K., Electrical and thermal properties of semiconducting glasses As–Te–Ge, Solid State Comm. 8 (1970) 153–155.

Ishikawa, R.; Kikuchi, M., Photovoltaic study on the photo–enhanced diffusion of Ag in amorphous films of Ge2S3, J. Non–Cryst. Solids 35 & 36 (1980) 1061–1066.

Iyetomi, H.; Vashishta, P.; Kalia, R.K., Incipient phase separation in Ag/Ge/Se glasses: clustering of Ag atoms, J. Non–Cryst. Solids 262 (2000) 135–142.

Jones, G.; Collins, R.A., Switching properties of thin selenium films under pulsed bias, Thin Solid Films 40 (1977) L15–L18.

Joullie, A.M.; Marucchi, J., On the DC electrical conduction of amorphous As2Se7 before switching, Phys. Stat. Sol. (a) 13 (1972) K105–K109.

Joullie, A.M.; Marucchi, J., Electrical properties of the amorphous alloy As2Se5, Mat. Res. Bull 8 (1973) 433–442.

Kaplan, T.; Adler, D., Electrothermal switching in amorphous semiconductors. J. Non–Cryst. Solids 8–10 (1972) 538–543.

Kawaguchi, T.; Maruno, S.; Elliott, S.R., Optical, electrical, and structural properties of amorphous Ag–Ge–S and Ag–Ge–Se films and comparison of photoinduced and thermally induced phenomena of both systems, J. Appl. Phys. 79 (1996) 9096–9104.

Kawaguchi, T.; Masui, K., Analysis of change in optical transmission spectra resulting from Ag photodoping in chalcogenide film, Japn. J. Appl. Phys. 26 (1987) 15–21.

Kawasaki, M.; Kawamura, J.; Nakamura, Y.; Aniya, M., Ionic conductivity of Agx(GeSe3)1-x (0<=x<=0.571) glasses, Solid state Ionics 123 (1999) 259–269.

Kluge, G.; Thomas, A.; Klabes, R.; Grotzschel, R., Silver photodiffusion in amorphous GexSe100-x, J. Non–Cryst. Solids 124 (1990) 186–193.

Kolobov, A.V., On the origin of p–type conductivity in amorphous chalcogenides, J. Non–Cryst. Solids 198–200 (1996) 729–731.

Kolobov, A.V., Lateral diffusion of silver in vitreous chalcogenide films, J. Non–Cryst. Solids 137–138 (1991) 1027–1030.

Korkinova, Ts.N.; Andreichin,R.E., Chalocogenide glass polarization and the type of contacts, J. Non–Cryst. Solids 194 (1996) 256–259.

Kotkata, M.F.; Afif, M.A.; Labib, H.H.; Hegab, N.A.; Abdel–Aziz, M.M., Memory switching in amorphous GeSeTl chalcogenide semiconductor films, Thin Solid Films 240 (1994) 143–146.

Lakshminarayan, K.N.; Srivastava, K.K.; Panwar, O.S.; Dumar. A., Amorphous semiconductor devices: memory and switching mechanism, J. Instn Electronics & Telecom. Engrs 27 (1981) 16–19.

Lal, M.; Goyal N., Chemical bond approach to study the memory and threshold switching chalcogenide glasses, Indian Journal of pure & appl. phys. 29 (1991) 303–304.

Leimer, R.; Stotzel, H.; Kottwitz, A., Isothermal electrical polarisation of amorphous GeSe films with blocking Al contacts influenced by Poole–Frenkel conduction, Phys. Stat. Sol. (a) 29 (1975) K129–K132.

Leung, W.; Cheung, N.; Neureuther, A.R., Photoinduced diffusion of Ag in GexSe1-x glass, Appl. Phys. Lett., 46 (1985) 543–545.

Matsushita, T.; Yamagami, T.; Okuda, M., Polarized memory effect observed on Se–SnO2 system, Jap. J. Appl. Phys. 11 (1972) 1657–1662.

Matsushita, T.; Yamagami, T.; Okuda, M., Polarized memory effect observed on amorphous selenium thin films Jpn. J. Appl. Phys. 11 (1972) 606.

Mazurier, F.; Levy, M.; Souquet, J.L, Reversible and irreversible electrical switching in TeO2–V205 based glasses, Journal de Physique IV 2 (1992) C2–185–C2–188.

Messoussi, R.; Bernede, J.C.; Benhida, S.; Abachi, T.; Latef. A., Electrical characterization of M/Se structures (M=Ni, Bi), Mat. Chem. And Phys 28 (1991) 253–258.

Mitkova, M.; Boolchand, P., Microscopic origin of the glass forming tendency in chalogenides and constraint theory, J. Non–Cryst. Solids 240 (1998) 1–21.

Mitkova, M.; Kozicki, M.N., Silver incorporation in Ge–Se glasses used in programmable metallization cell devices, J. Non–Cryst. Solids 299–302 (2002) 1023–1027.

Mitokova, M.; Wang, Y.; Boolchand, P., Dual chemical role of Ag as an additive in chalcogenide glasses, Phys. Rev. Lett. 83 (1999) 3848–3851.

Miyatani, S.–y., Electronic and ionic conduction in (AgxCu1-x)2Se, J. Phys. Soc. Japan 34 (1973) 423–432.

Miyatani, S.–y., Electrical properties of Ag2Se, J. Phys. Soc. Japan 13 (1958) 317.

Miyatani, S.–y., Ionic conduction in beta–Ag2Te and beta–Ag2Se, Journal Phys. Soc. Japan 14 (1959) 996–1002.

Mott, N.F., Conduction in glasses containing transition metal ions, J. Non–Cryst. Solids 1 (1968) 1–17.

Nakayama, K.; Kitagawa, T.; Ohmura, M.; Suzuki, M., Nonvolatile memory based on phase transitions in chalcogenide thin films, Jpn. J. Appl. Phys 32 (1993) 564–569.

Nakayama, K.; Kojima, K.; Hayakawa, F.; Imai, Y.; Kitagawa, A.; Suzuki, M., Submicron nonvolatile memory cell based on reversible phase transition in chalcogenide glasses, Jpn. J. Appl. Phys. 39 (2000) 6157–6161.

Nang, T.T.; Okuda, M.; Matsushita, T.; Yokota, S.; Suzuki, A., Electrical and optical parameters of GexSe1−x amorphous thin films, Jap. J. App. Phys 15 (1976) 849–853.

Narayanan, R.A.; Asokan, S.; Kumar, A., Evidence concerning the effect of topology on electrical switching in chalcogenide network glasses, Phys. Rev. B54 (1996) 4413–4415.

Neale, R.G.; Aseltine, J.A., The application of amorphous meterials to computer memories, IEEE transactions on electron dev. Ed–20 (1973) 195–209.

Ovshinsky S.R.; Fritzsche, H., Reversible structural transformations in amorphous semiconductors for memory and logic, Mettalurgical transactions 2 (1971) 641–645.

Ovshinsky, S.R., Reversible electrical switching phenomena in disordered structures, Phys. Rev. Lett. 21 (1968) 1450–1453.

Owen, A.E.; LeComber, P.G.; Sarrabayrouse, G.; Spear, W.E., New amorphous–silicon electrically programmable nonvolatile switching device, IEE Proc. 129 (1982) 51–54.

Owen, A.E.; Firth, A.P.; Ewen, P.J.S., photo–induced structural and physico–chemical changes in amorphous chalcogenide semiconductors, Phil. Mag. B 52 (1985) 347–362.

Owen, A.E.; Le Comber, P.G.; Hajto, J.; Rose, M.J.; Snell, A.J., Switching in amorphous devices, Int. J. Electronics 73 (1992) 897–906.

Pearson, A.D.; Miller, C.E., Filamentary conduction in semiconducting glass diodes, App. Phys. Lett. 14 (1969) 280–282.

Pinto, R.; Ramanathan, K.V., Electric field induced memory switching in thin films of the chalcogenide system Ge–As–Se, Appl. Phys. Lett. 19 (1971) 221–223.

Popescu, C., The effect of local non–uniformities on thermal switching and high field behavior of structures with chalcogenide glasses, Solid–state electronics 18 (1975) 671–681.

Popescu, C.; Croitoru, N., The contribution of the lateral thermal instability to the switching phenomenon, J. Non–Cryst. Solids 8–10 (1972) 531–537.

Popov, A.I; Geller, I.KH.; Shemetova, V.K., Memory and threshold switching effects in amorphous selenium, Phys. Stat. Sol. (a) 44 (1977) K71–K73.

Prakash, S.; Asokan, S.; Ghare, D.B., Easily reversible memory switching in Ge–As–Te glasses, J. Phys. D: Appl. Phys 29 (1996) 2004–2008.

Rahman, S.; Silvarama Sastry, G., Electronic switching in Ge–Bi–Se–Te glasses, Mat. Sci. and Eng. B12 (1992) 219–222.

Ramesh, K.; Asokan. S.; Sangunni, K.S.; Gopal, E.S.R., Electrical Switching in germanium telluride glasses doped with Cu and Ag, Appl. Phys. A 69 (1999) 421–425.

Rose,M.J.;Hajto,J.;Lecomber,P.G.;Gage,S.M.;Choi,W.K.;Snell,A.J.;Owen, A.E., Amorphous silicon analogue memory devices, J. Non–Cryst. Solids 115 (1989) 168–170.

Rose, M.J.;Snell,A.J.;Lecomber,P.G.;Hajto,J.;Fitzgerald, A.G.;Owen,A.E., Aspects of non–volatility in a–Si:H Memory devices, Mat. Res. Soc. Symp. Proc. V 258, 1992, 1075–1080.

Schuocker, D.; Rieder, G., On the reliability of amorphous chalcogenide switching devices, J. Non–Cryst. Solids 29 (1978) 397–407.

Sharma, A.K.; Singh. B., Electrical conductivity measurements of evaporated selenium films in vacuum, Proc. Indian Natn. Sci. Acad. 46, A, (1980) 362–368.

Sharma, P., Structural, electrical and optical properties of silver selenide films, Ind. J. Of pure and applied phys. 35 (1997) 424–427.

Snell, A.J.; Lecomber, P.G.; Hajto, J.; Rose, M.J.; Owen, A.E.; Osborne, I.L., Analogue memory effects in metal/a–Si:H/metal memory devices, J. Non–Cryst. Solids 137–138 (1991) 1257–1262.

Snell, A.J.; Hajto, J.;Rose, M.J.; Osborne, L.S.; Holmes, A.; Owen, A.E.; Gibson, R.A.G., Analogue memory effects in metal/a–Si:H/metal thin film structures, Mat. Res. Soc. Symp. Proc. V 297, 1993, 1017–1021.

Steventon, A.G., Microfilaments in amorphous chalcogenide memory devices, J. Phys. D: Appl. Phys 8 (1975) L120–L122.

Steventon, A.G., The switching mechanism in amorphous chalcogenide memory devices, J. Non–Cryst. Solids 21 (1976) 319–329.

Stocker, H.J., Bulk and thin film switching and memory effects in semiconducting chalcogenide glasses, App. Phys. Lett. 15 (1969) 55–57.

Tanaka, K., Ionic and mixed conductions in Ag photodoping process, Mod. Phys. Lett B 4 (1990) 1373–1377.

Tanaka, K.; Iizima, S.; Sugi, M.; Okada, Y.; Kikuchi, M., Thermal effects on switching phenomenon in chalcogenide amorphous semiconductors, Solid State Comm. 8 (1970) 387–389.

Thornburg, D.D., Memory switching in a Type I amorphous chalcogenide, J. Elect. Mat. 2 (1973) 3–15.

Thornburg, D.D., Memory switching in amorphous arsenic triselenide, J. Non–Cryst. Solids 11 (1972) 113–120.

Thornburg, D.D.; White, R.M., Electric field enhanced phase separation and memory switching in amorphous arsenic triselenid, Journal(??) (1972) 4609–4612.

Tichy, L.; Ticha, H., Remark on the glass–forming ability in GexSe1–x and AsxSe1–x systems, J. Non–Cryst. Solids 261 (2000) 277–281.

Titus, S.S.K.; Chatterjee, R.; Asokan, S., Electrical switching and short–range order in As–Te glasses, Phys. Rev. B 48 (1993) 14650–14652.

Tranchant,S.;Peytavin,S.;Ribes,M.;Flank,A.M.;Dexpert, H.;Lagarde,J.P., Silver chalcogenide glasses Ag–Ge–Se: Ionic conduction and exafs structural investigation, Transport–structure relations in fast ion and mixed conductors Proceedings of the 6th Riso International symposium. Sep. 9–13, 1985.

Tregouet, Y.; Bernede, J.C., Silver movements in Ag2Te thin films: switching and memory effects, Thin Solid Films 57 (1979) 49–54.

Uemura, O.; Kameda, Y.; Kokai, S.; Satow, T., Thermally induced crystallization of amorphous Ge0.4Se0.6, J. Non–Cryst. Solids 117–118 (1990) 219–221.

Uttecht, R.; Stevenson, H.; Sie, C.H.; Griener, J.D.; Raghavan, K.S., Electric field induced filament formation in As–Te–Ge glass, J. Non–Cryst. Solids 2 (1970) 358–370.

Viger, C.; Lefrancois, G.; Fleury, G., Anomalous behaviour of amorphous selenium films, J. Non–Cryst. Solids 33 (1976) 267–272.

Vodenicharov, C.; Parvanov,S.; Petkov, P., Electrode–limited currents in the thin–film M–GeSe–M system, Mat. Chem. And Phys. 21 (1989) 447–454.

Wang, S.–J.; Misium, G.R.; Camp, J.C.; Chen, K.–L.; Tigelaar, H.L., High performance Metal/sillicide antifuse, IEEE electron dev. Lett. 13 (1992)471–472.

Weirauch, D.F., Threshold switching and thermal filaments in amorphous semiconductors, App. Phys. Lett. 16 (1970) 72–73.

West, W.C.; Sieradzki, K.; Kardynal, B.; Kozicki, M.N., Equivalent circuit modeling of the Ag|As0.24S0.36Ag0.40|Ag System prepares by photodissolution of Ag, J. Electrochem. Soc. 145 (1998) 2971–2974.

West, W.C., Electrically erasable non–volatile memory via electrochemical deposition of multifractal aggregates, Ph.D. Dissertation, ASU 1998.

Zhang, M.; Mancini, S.; Bresser, W.; Boolchang, P., Variation of glass transition temperature, Tg, with average coordination number, <m>, in network glasses: evidence of a threshold behavior in the slope |dTg/d<m>| at the rigidity percolation threshold (<m>=2.4), J. Non–Cryst. Solids 151 (1992) 149–154.

Axon Technologies Corporation, Technology Description: *Programmable Metalization Cell(PMC)*, pp. 1–6 (Pre–May 2000).

Helbert et al., *Intralevel hybrid resist process with submicron capability*, SPIE vol. 333 Submicron Lithography, pp. 24–29 (1982).

Hilt, Dissertation: *Materials characterization of Silver Chalcogenide Programmable Metalization Cells*, Arizona State University, pp. Title page–114 (UMI Company, May 1999).

Hirose et al., *High Speed Memory Behavior and Reliability of an Amorphous $As_2S_3$ Film Doped Ag*, Phys. Stat. Sol. (a) 61, pp. 87–90 (1980).

Holmquist et al., *Reaction and Diffusion in Silver–Arsenic Chalcogenide Glass Systems*, 62 J. Amer. Ceram. Soc., No. 3–4, pp. 183–188 (Mar.–Apr. 1979).

Huggett et al., *Development of silver sensitized germanium selenide photoresist by reactive* sputter etching in $SF_6$, 42 Appl. Phys. Lett., No. 7, pp. 592–594 (Apr. 1983).

Kawaguchi et al., *Mechanism of photosurface deposition*, 164–166 J. Non–Cryst. Solids, pp. 1231–1234 (1993).

Kolobov and Elliott, Photodoping of Amorphous Chalcogenides by Metals, Advances in Physics, vol. 40, No. 5, 625–684 (1991).

Kozicki, et al., "Applications of Programmable Resistance Changes in Metal–doped Chalcogenides", Proceedings of the 1999 Symposium on Solid State Ionic Devices, Editors—E.D. Wachsman et al., The Electrochemical Society, Inc., 1–12 (1999).

Kozicki, et al., *Nanoscale effects in devices based on chalcogenide solid solutions*, Superlattices and Microstructures, 27, 485–488 (2000).

Kozicki, et al., *Nanoscale phase separation in Ag–Ge–Se glasses*, Microelectronic Engineering, vol. 63/1–3, 155–159 (2002).

M.N. Kozicki and M. Mitkova, *Silver incorporation in thin films of selenium rich Ge–Se glasses*, Proceedings of the XIX International Congress on Glass, Society for Glass Technology, 226–227 (2001).

McHardy et al., *The dissolution of metals in amorphous chalcogenides and the effects o electron and ultraviolet radiation*, 20 J. Phys. C.: Solid State Phys., pp. 4055–4075 (1987)f.

Owen et al., *Metal–Chalcogenide Photoresists for High Resolution Lithography and Sub–Micron Structures*, Nanostructure Physics and Fabrication, pp. 447–451 (M. Reed ed. 1989).

Shimizu et al., *The Photo–Erasable Memory Switching Effect of Ag Photo–Doped Chalcogenide Glasses*, 46 B. Chem Soc. Japan, No. 12, pp. 3662–3365 (1973).

Michael N. Kozicki, 1. Programmable Metallization Cell Technology Description, Feb. 18, 2000.

Michael N. Kozicki, Axon Technologies Corp. and Arizona State University, Presentation to Micron Technology, Inc., Apr. 6, 2000.

* cited by examiner

MULTIPLE DATA STATE MEMORY CELL

TECHNICAL FIELD

The invention relates to random access memories ("RAMs"), and more particularly to memory cells of a RAM capable of storing data in multiple data states.

BACKGROUND OF THE INVENTION

Random access memory devices are an integral part of any computing environment. Without these memory devices, processing data in a computing device would be nearly impossible. Consequently, there has been a great amount of research and development directed to the area of random access computer memory. The research and development has been directed to different areas related to computer memory, for example, in increasing the speed at which data stored by the memory devices can be accessed, in designing memories with lower power consumption, and in engineering memory devices having greater data retention times. Additionally, one particular area to which a great amount of effort has been spent is in the areas of increasing memory density and data capacity.

One conventional approach to increasing memory density has been to decrease the size of memory devices, and more particularly, decrease the size of memory cells. As a result, the size of memory cells have been reduced dramatically in the recent past. However, the size of memory cells have diminished to the point where the current state of processing technology is being constantly challenged when manufacturing memory devices with these feature sizes. Another approach to the memory density and data capacity issue has been experiment with memory devices that are capable of storing data in more states than conventional binary memory. That is, conventional memory stores data in a binary format, where data is stored as either one of two different data states. With multiple data state memory, data can be stored as one of many different states, where the number of different states is greater than two. As a result, with multiple data state memory, generally less memory cells need to be used to store data. For example, a memory cell having four different data states can be substituted for two conventional memory cells having only two different data states. Consequently, only half as many memory cells would be needed to store the same quantity of data. Conversely, twice as much data can be stored in the same area if the multiple data state memory is the same size as conventional memory cells.

An example of the type of work that has been done in the area of multiple data state memory is provided in several U.S. patents to Ovshinsky et al. For example, in U.S. Pat. No. 5,296,716 to Ovshinsky et al., the use of electrically writeable and erasable phase change materials for electronic memory applications is described. Additionally, in U.S. Pat. No. 5,912,839 to Ovshinsky et al., a method of programming Ovonic memory multistate-digital multibit memory elements and the use in data storage is described. As described therein, a memory element including the phase change material, that is, materials which can be electrically switched between generally amorphous and generally crystalline, can be programmed by using a number of current pulses. In determining the data state of the memory element, the number of pulses can be discerned by counting the number of pulses required to return the resistance level of the memory element to a first state. The number of pulses represents the data state of the data stored by the memory element. As further described in the aforementioned patent, the process of reading the present state of the memory element is destructive, and consequently, requires that the data is reprogrammed following a read.

Another approach that has been taken in the design of multiple data state memory is described in U.S. patents to Kozicki et al. As described therein, a programmable metallization cell (PMC) formed from a fast ion conductor, such as a chalcogenide material that include compounds containing sulfur, selenium and tellurium, positioned between two electrodes. The formation of a non-volatile metal dendrite can be induced by application of a voltage difference between the two electrodes. The mass of the non-volatile dendrite changes the resistance of the PMC, which can be used as a means to store data in various states. Further described in the aforementioned patents are various structural embodiments of a PMC in different applications.

Although there has been development in the area of multiple data state and variable resistance memories, it will be appreciated that new and alternative approaches to this area is still possible. For example, further development in the area of multiple data state memory cells having true quantization of data states. Therefore, there is a need for alternative approaches to storing data in multiple data states.

SUMMARY OF THE INVENTION

The present invention is directed to a multiple data state memory cell. The memory cell includes a first electrode layer formed from a first conductive material, a second electrode layer formed from a second conductive material, and a first layer of a metal-doped chalcogenide material disposed between the first and second electrode layers, the first layer providing a medium in which a conductive growth can be formed to electrically couple together the first and second electrode layers. The memory cell further includes a third electrode layer formed from a third conductive material, and a second layer of a metal-doped chalcogenide material disposed between the second and third electrode layers, the second layer providing a medium in which a conductive growth can be formed to electrically couple together the second and third electrode layers.

As is conventional in the field of integrated circuit representation, the lateral sizes and thicknesses of the various layers are not drawn to scale and may have been enlarged or reduced to improve drawing legibility.

DETAILED DESCRIPTION OF THE INVENTION

Embodiments of the present invention provide a multiple state memory cell. Certain details are set forth below to provide a sufficient understanding of the invention. However, it will be clear to one skilled in the art that the invention may be practiced without these particular details. In other instances, well-known fabrication techniques processing methods, circuits, control signals, and timing protocols have not been shown in detail in order to avoid unnecessarily obscuring the invention.

Figure 1:
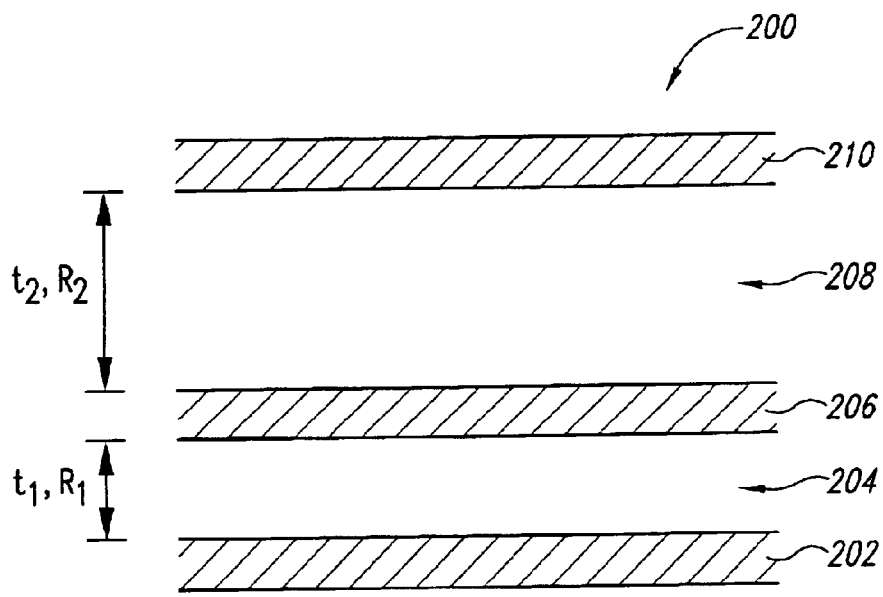
FIG. 1 is a cross-sectional view of an embodiment of the invention.

Illustrated in FIG. 1 is a cross-sectional view of a portion of a multiple-state memory cell 200 according to an embodiment of the present invention. A metal electrode layer 202 is formed to provide a cathode layer to which a voltage is applied. It will be appreciated that the metal layer 200 may be formed on a substrate, or on a layer of material which will support the multiple-state memory cell 200. Formed on the metal layer 200 is a metal-doped chalcogenide layer 204 through which, as will be explained in more detail below, a conductive link to floating electrode layer 206 is formed under the application of a voltage. Chalcogenide materials, as referred to herein, include those compounds of sulfur, selenium, and tellurium. The metal material doping the chalcogenide are generally Group I or Group II metals, such as silver, copper, zinc, and combinations thereof. The floating electrode layer 206 is typically formed from a metal material, such as silver.

Formed on the floating electrode layer 206 is a another metal-doped chalcogenide layer 208. The composition of the material for layer 208 may be, but does not necessarily need to be, the same as the layer 204. As illustrated in FIG. 2, the thickness $t_2$ of the layer 208 is greater than the thickness $t_1$ of the layer 204. However, in other embodiments of the present invention, the thicknesses $t_2$ and $t_1$ may be nearly or approximately the same, or the thickness $t_2$ may be less than $t_1$. As will be explained in more detail below, the composition of the respective metal-doped chalcogenide layers 206 and 208 may need to be modified in order to accommodate layers 206 and 208 having various thicknesses. Formed on the metal-doped chalcogenide layer 208 is another metal electrode layer 210, which represents an anode of the multiple-state memory cell 200. The metal electrode layer 210 and the floating electrode layer 206 are typically formed from the same material. As illustrated in FIG. 1, the cathode is formed below the anode, however, it will be appreciated that the arrangement of the two layers may be reversed as well without departing from the scope of the present invention. Moreover, the vertical orientation illustrated in FIG. 1 can be changed such that the various layers are formed in a horizontal orientation between a cathode and an anode that are laterally spaced apart from one another.

It will be appreciated that many materials known by those of ordinary skill in the art may be used for the metal-doped chalcogenide layers. For example, compositions of germanium selenide, $Ge_xSe_y$, can be used. Exemplary ratios are in the range from $Ge_{20}Se_{80}$ to GeSe. Compositions of arsenic sulfide, germanium telluride, and germanium sulfide can also be used for the metal-doped chalcogenide layers. Similarly, materials that can be used for the electrode layers are also known, such as silver, compositions of silver selenide, copper, germanium selenide, and the like. It will be appreciated that later developed materials that display the same characteristics as known materials can also be used for the metal-doped chalcogenide and electrode layers without deviating from the scope of the present invention.

In operation, the multiple-state memory cell 200 illustrated in FIG. 1 is capable of storing multiple states by altering or programming the total resistance between the anode and the cathode in a relatively digital fashion. The resistance of the memory cell 200 can then measured or compared to determine the value of the data stored by the memory cell 200. As a result of the relatively discrete manner in which the resistance can be changed, multiple states can be stored by the memory cell 200.

The alteration of the resistance is accomplished by the formation of a conductive growth from the metal electrode layer 202 (i.e., the cathode) through the layer 204 to electrically contact the floating electrode layer 206, and the formation of a conductive growth from the floating electrode layer 206 through the layer 208 to electrically contact the metal electrode layer 210 (i.e., the anode). The formation of the conductive growth is induced by creating a voltage difference between the cathode and the anode, such as by applying a voltage to the anode and grounding the cathode.

Figure 2A:
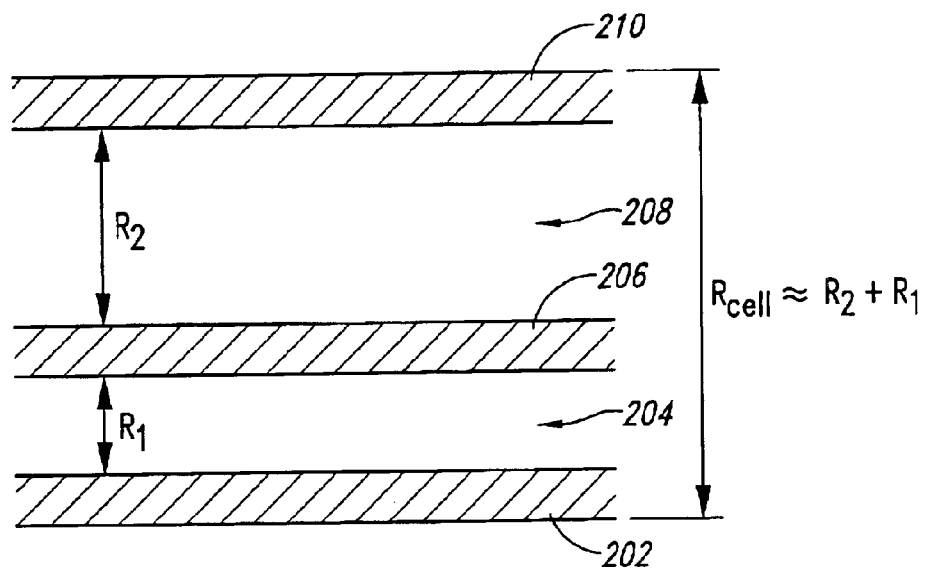
FIGS. 2a–c are cross-sectional views of the embodiment of FIG. 1 illustrating the operation thereof.
Figure 2B:
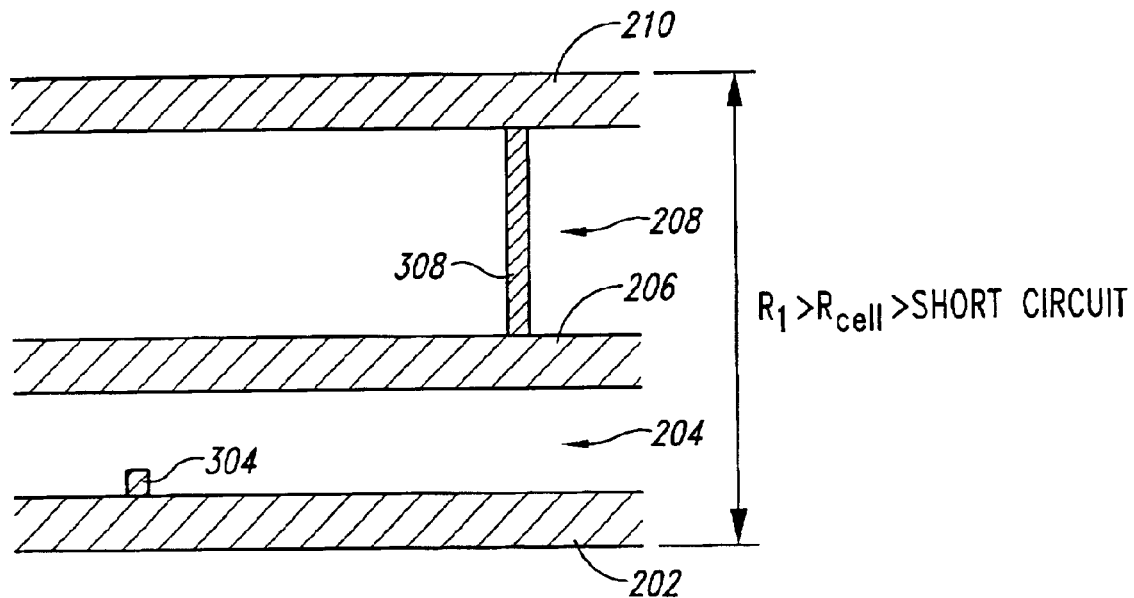
Figure 2C:
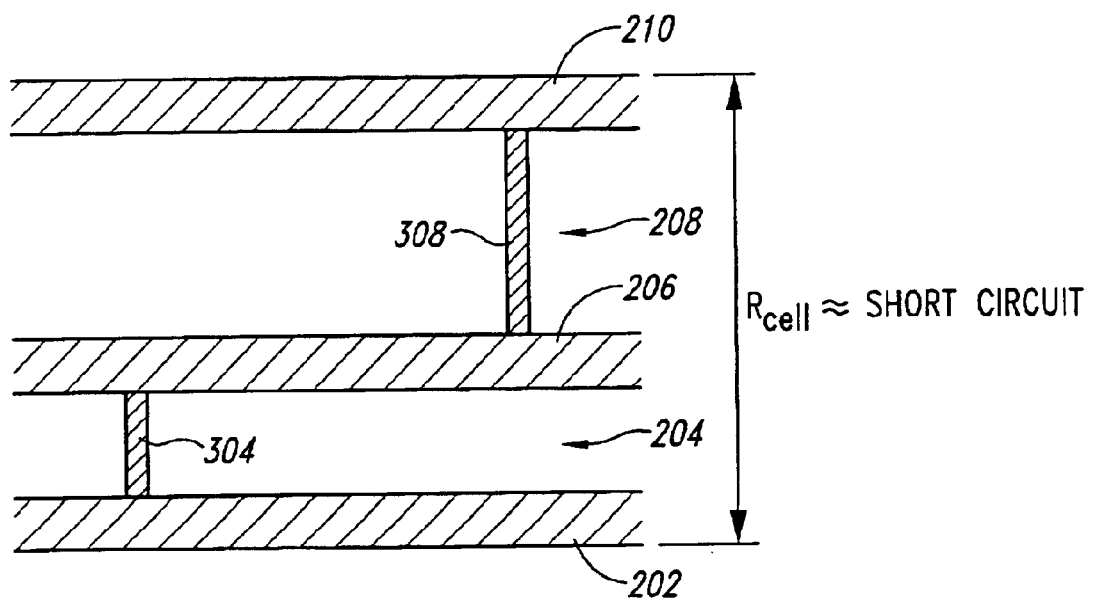

Each time a conductive growth creates a short circuit, the resistance between the anode and the cathode changes relatively significantly. Initially, as shown in FIG. 2a, where no conductive growth has been formed, the resistance between the anode and the cathode $R_{cell}$ is equal to approximately $R_1+R_2$, where $R_1$ is the resistance of the layer 204 and $R_2$ is the resistance of the layer 208. However, under the influence of an applied bias across the metal-doped chalcogenide layers 202, 210, conductive growths 304 and 308 begin to form through the layers 204 and 208, respectively. When the conductive growth 308 extends through the layer 208 and creates a short circuit between the the floating electrode layer 206 and the anode, which is represented by the layer 210, as shown in FIG. 2b, the resistance $R_{cell}$ between the anode and the cathode changes to a value less than $R_1$ but greater than a short circuit. The resistance $R_{cell}$ at this point is reproducible, and consequently, can be used to represent a data state. The resistance $R_{cell}$ changes again, as shown in FIG. 2c, to a relatively low resistance when a conductive growth 304 extends through the layer 204 and creates a short circuit between the cathode, which is represented by the layer 202, and the floating electrode layer 206.

Each of the different resistance states of $R_{cell}$ provided by the memory cell 200 represents a different data or logic state. That is, a first data state is represented by $R_{cell}$ being approximately equal to the total resistance (R1+R2), a second data state is represented by $R_{cell}$ being a value between $R_1$ and low resistance, which occurs when the floating electrode layer 206 is short circuited to the metal electrode layer 210 by the conductive growth 308, and a third data state is represented by a low resistance after the metal electrode layer 202 is short circuited to the floating electrode layer 206 by the conductive growth 304. A reading circuit coupled to the memory cell 200 measures the resistance of the memory cell 200 in order to determine the data stored by the cell.

The growth of the conductive growths 304 and 308 is dependent on the orientation of the electrical field applied to the memory cell 200. That is, as discussed so far, a voltage applied to the metal electrode layer 210 (i.e., the anode) is positive relative to the voltage applied to the metal electrode layer 202 (i.e., the cathode), thus, the direction of growth is from the metal electrode layer 202 to the floating electrode layer 206. Similarly, a conductive growth will be formed extending from the floating electrode layer 206 to the metal electrode layer 210. However, it will be appreciated that application of the voltage in an opposite polarity will reduce whatever conductive growth has been previously formed. Consequently, the memory cell 200 can be programmed to store a different data state by changing the polarity of the applied voltage to the memory cell 200 during a read or write operation to change the resistance of the memory cell 200.

It will be further appreciated that reading and writing circuitry for use with embodiments of the present invention is well known to those of ordinary skill in the art, and may be implemented using conventional circuitry and design. It will be further appreciated that the description provided herein is sufficient to enable one of ordinary skill in the art to practice the invention.

As illustrated in FIG. 2b, application of a voltage to the anode induces the formation of not only conductive growth 304, but conductive growth 308 as well. However, because the thickness of the layer 208 is greater than the thickness of the layer 204, for a given applied voltage across the multiple state memory cell 200 the voltage across the layer 208 is greater than the voltage across the layer 204. Consequently, the floating electrode 206 is short circuited to the anode before the cathode is short circuited to the floating electrode 206. With continued application of a voltage to the anode, the conductive growth 304 eventually creates a short circuit between the cathode and the floating electrode 206, thus reducing the resistance between the anode and the cathode to a low resistance. Moreover, it will be appreciated that the resistance $R_{cell}$ across the anode and cathode is between $R_1$ and a short circuit after the conductive growth 308 short circuits the floating electrode 206 to the anode 210 because the resistance of the layer 204 is actually reduced as the conductive growth 304 grows toward the floating electrode 206. However, the resistance $R_{cell}$ at this point is nevertheless reproducible and different enough from the short circuited state that conventional reading circuits for multiple-state memory cells can consistently recognize the data state.

It will be further appreciated that the range of resistances, or the transition from one resistance relative to one another can be adjusted by altering the thickness of the layers 204 and/or 208. Additionally, as previously mentioned, the composition of the metal-doped chalcogenide material of the layers 204 and 208 can be adjusted as well to adjust the points of transition in the resistance.

Figure 3:
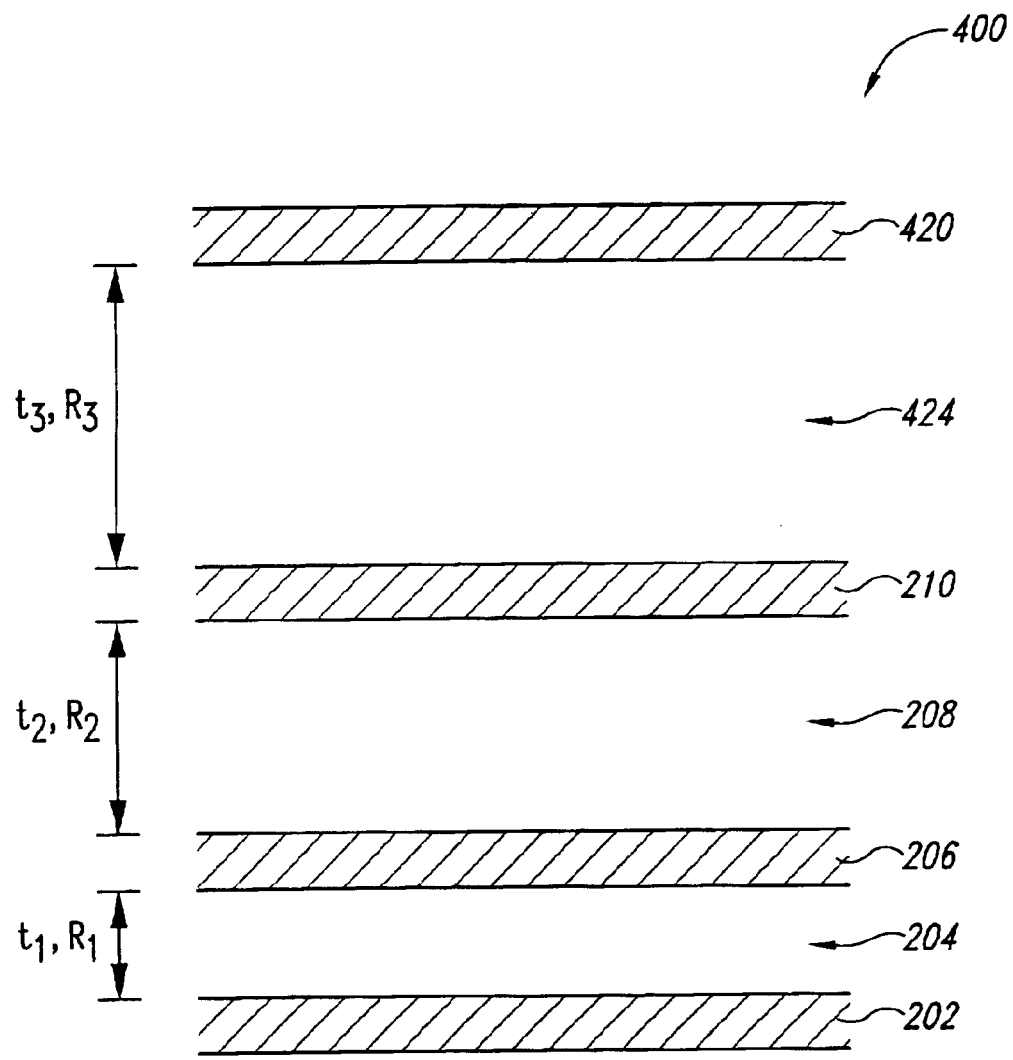
FIG. 3 is a cross-sectional view of another embodiment of the invention.

Illustrated in FIG. 3 is a portion of a memory cell 400 according to another embodiment of the present invention. The memory cell 400 includes layers that are similar to those of the memory cell 200 (FIG. 1). However, memory cell 400 further includes a second floating electrode 420 and a third metal-doped chalcogenide layer 424 in addition to the layers described with respect to the memory cell 200. The addition of the second floating electrode 420 and the third metal-doped chalcogenide layer 424 enables the memory cell 400 to have an additional memory state in which to store data. That is, whereas the memory cell 200 provides three different states or resistances $R_{cell}$: $(R_2+R_1)$, between $R_1$ and low resistance, and low resistance, the memory cell 400 provides four different states or resistances for $R_{cell}$: $(R_3+R_2+R_1)$, between $(R_2+R_1)$ and $R_1$, between $R_1$ and low resistance, and low resistance. As previously discussed, each different resistance level can be used to represent a different state of data.

As illustrated by the previous discussion, it will be appreciated that including additional layers formed from a metal-doped chalcogenide material and a floating electrode can be used to create memory cells having even more states than that provided by the memory cell 400.

Figure 4:
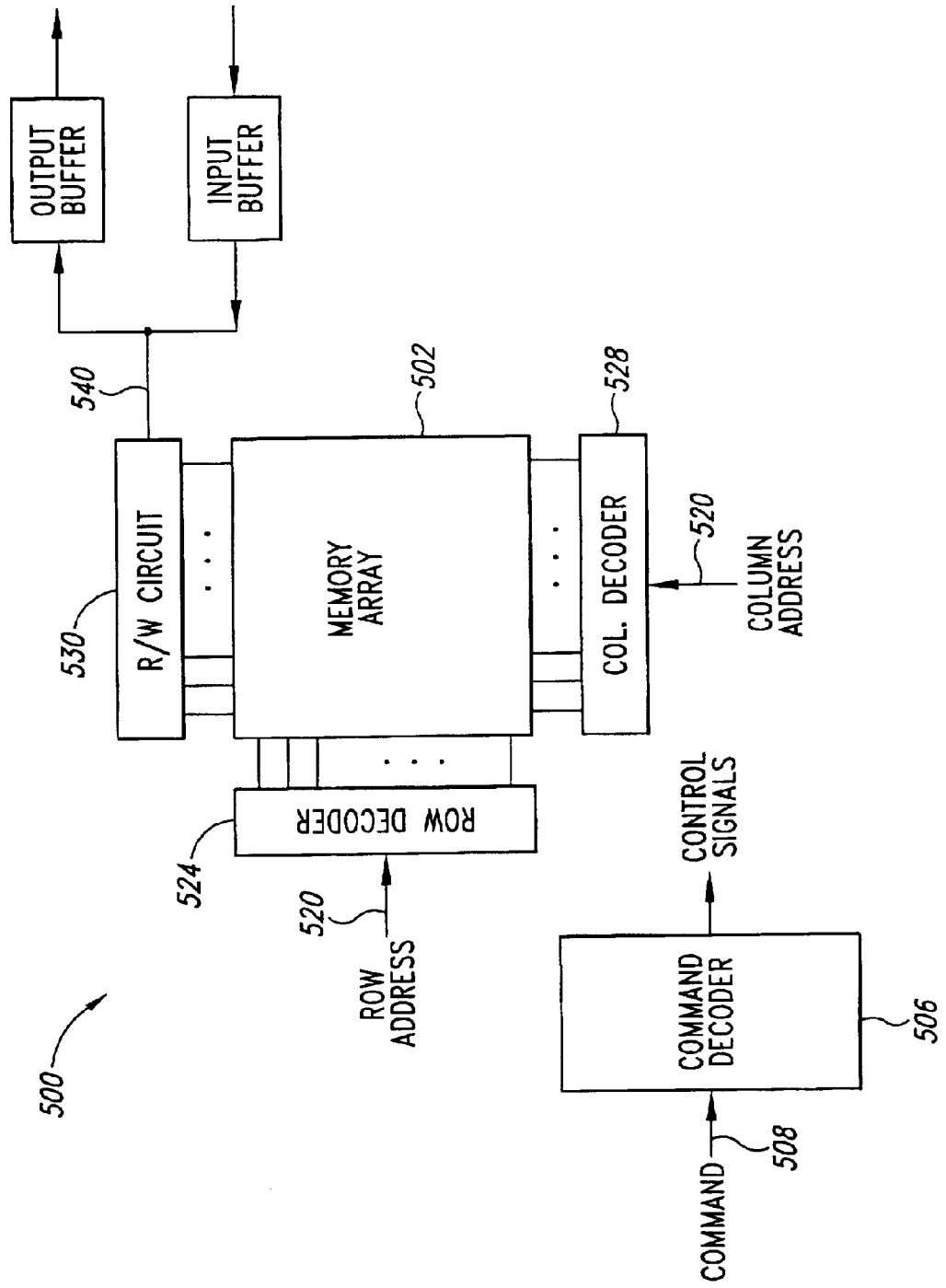
FIG. 4 is a block diagram of a typical memory device that includes one or more memory arrays of the present embodiment.

A memory device 500 that includes a memory array 502 having memory cells according to an embodiment of the invention is shown in FIG. 4. The memory device 500 includes a command decoder 506 that receives memory command through a command bus 508 and generates corresponding control signals. A row or column address is applied to the memory device 500 through an address bus 520 and is decoded by a row address decoder 524 or a column address decoder 528, respectively. Memory array read/write circuitry 530 are coupled to the array 502 to provide read data to a data output buffer 534 via a input-output data bus 540. Write data are applied to the memory array through a data input buffer 544 and the memory array read/write circuitry 530.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A multiple-state memory cell, comprising:
   a first electrode layer formed from a first conductive material;
   a second electrode layer formed from a second conductive material;
   a first layer of a metal-doped chalcogenide material disposed between the first and second electrode layers, the first layer providing a medium in which a conductive growth can be formed to electrically couple together the first and second electrode layers;
   a third electrode layer formed from a third conductive material; and
   a second layer of a metal-doped chalcogenide material disposed between the second and third electrode layers, the second layer providing a medium in which a conductive growth can be formed to electrically couple together the second and third electrode layers.

2. The memory cell of claim 1 wherein the first conductive material comprises a composition of a silver material.

3. The memory cell of claim 1 wherein at least one of the first or second layers of metal-doped chalcogenide material is a material selected from the group consisting of germanium selenide, arsenic sulfide, germanium telluride, and germanium sulfide.

4. The memory cell of claim 1 wherein the material of at least one of the first or second layers of metal-doped chalcogenide material comprises a composition of germanium selenide.

5. The memory cell of claim 1 wherein the conductive material of the first, second and third electrodes is the same.

6. The memory cell of claim 1 wherein the thickness of the first layer of a metal-doped chalcogenide material is less than the thickness of the second layer of a metal-doped chalcogenide material.

7. The memory cell of claim 1 wherein the thickness of the second layer of a metal-doped chalcogenide material is less than the thickness of the first layer of a metal-doped chalcogenide material.

8. The memory cell of claim 1, further comprising:
   a fourth electrode formed from a fourth conductive material; and
   a third layer of a metal-doped chalcogenide material disposed between the third and fourth electrode layers, the third layer providing a medium in which a conductive growth can be formed to electrically couple together the third and fourth electrodes.

9. The memory cell of claim 1 wherein the metal-doped chalcogenide material of the first and second layers are the same.

10. The memory cell of claim 1 wherein the metal-doped chalcogenide material of the first and second layers comprise a silver glass material.

11. A multiple state memory cell, comprising:
    a first electrode layer formed from a first conductive material;

a second electrode layer formed from a second conductive material;

a first layer of a metal-doped chalcogenide material disposed between and adjoining the first and second electrode layers, the first layer providing a medium in which a conductive growth can be formed to electrically couple together the first and second electrode layers;

a third electrode layer formed from a third conductive material;

a second layer of a metal-doped chalcogenide material disposed between and adjoining the second and third electrode layers, the second layer providing a medium in which a conductive growth can be formed to electrically couple together the second and third electrode layers;

a fourth electrode layer formed from a fourth conductive material; and a third layer of a metal-doped chalcogenide material disposed between and adjoining the third and fourth electrode layers, the third layer providing a medium in which a conductive growth can be formed to electrically couple together the third and fourth electrode layers.

12. The memory cell of claim 11 wherein at least one of the first, second, third, and fourth electrode layers comprises a composition of a silver material.

13. The memory cell of claim 11 wherein the first, second, third, and fourth conductive material are the same.

14. The memory cell of claim 11 wherein the thickness of the first layer of a metal-doped chalcogenide material is less than the thickness of the second layer of a metal-doped chalcogenide material, and the thickness of the second layer of a metal-doped chalcogenide material is less than the thickness of the third layer of a metal-doped chalcogenide material.

15. The memory cell of claim 11 wherein the metal-doped chalcogenide material of the first, second, and third layers are the same.

16. The memory cell of claim 11 wherein the metal-doped chalcogenide material of at least one of the first, second, or third layers comprises a material selected from the group consisting of germanium selenide, arsenic sulfide, germanium telluride, and germanium sulfide.

17. The memory cell of claim 11 wherein the metal-doped chalcogenide material of at least one of the first, second, or third layers comprises a composition of germanium selenide.

18. The memory cell of claim 11 wherein the first electrode is positioned below the second electrode, the second electrode is positioned below the third electrode, and the third electrode is positioned below the fourth electrode.

19. The memory cell of claim 11 wherein under the application of the programming voltage, the first conductive growth couples the third electrode to the first electrode prior to the second conductive growth coupling the second electrode to the third electrode.

20. A memory device, comprising:

a memory array comprising a plurality of memory cells arranged in rows and columns, each memory cell comprising:

a first electrode layer formed from a first conductive material and coupled to a respective row;

a second electrode layer formed from a second conductive material;

a first layer of a metal-doped chalcogenide material disposed between and adjoining the first and second electrode layers, the first layer providing a medium in which a conductive growth can be formed to electrically couple together the first and second electrode layers;

a third electrode layer formed from a third conductive material and coupled to a respective column; and a second layer of a metal-doped chalcogenide material disposed between and adjoining the second and third electrode layers, the second layer providing a medium in which a conductive growth can be formed to electrically couple together the second and third electrode layers;

a row address decoder for selecting a row of memory cells corresponding to a row address;

a column address decoder for selecting a column of memory cells corresponding to a column address;

reading and writing circuitry coupled to the memory array to read data from and write data to the memory cells selected by the row and column address decoders;

a data path coupled between the reading and writing circuitry and an external data terminal of the memory device; and a command decoder operable to generate control signals responsive to memory commands applied to the memory device.

21. The memory device of claim 20 wherein the first conductive layer of each memory cell is formed from a composition of a silver material.

22. The memory device of claim 20 wherein the conductive material of the first, second and third electrodes is the same.

23. The memory device of claim 20 wherein the thickness of the first layer of a metal-doped chalcogenide material is less than the thickness of the second layer of a metal-doped chalcogenide material.

24. The memory device of claim 20 wherein each memory cell further comprises:

a fourth electrode formed from a fourth conductive material; and a third layer of a metal-doped chalcogenide material disposed between the third and fourth electrode layers, the third layer providing a medium in which a conductive growth can be formed to electrically couple together the third and fourth electrodes.

25. The memory device of claim 20 wherein the metal-doped chalcogenide material of the first and second layers are the same.

26. The memory device of claim 20 wherein the metal-doped chalcogenide material of the first and second layers comprise a silver glass material.

27. The memory device of claim 20 wherein the metal-doped chalcogenide material of at least one of the first or second layers comprises a material selected from the group consisting of germanium selenide, arsenic sulfide, germanium telluride, and germanium sulfide.

28. The memory cell of claim 20 wherein the metal-doped chalcogenide material of at least one of the first or second layers comprises a composition of germanium selenide.

29. A memory device, comprising:

a memory array comprising a plurality of memory cells arranged in rows and columns, the memory cells comprising:

a first electrode coupled a respective row;
a second electrode coupled to a respective column;
a multiple layer data state stack in which multiple data states are stored, the data-state stack including:
  a first layer of a metal-doped chalcogenide material adjoining the first electrode, the first layer having a first thickness;
  a third electrode layer of a conductive material adjoining the first layer; and
  a second layer of a metal-doped chalcogenide material adjoining the third electrode layer, the second layer having a second thickness,
  wherein application of a programming voltage to the first electrode induces the formation of a first conductive growth from the third electrode layer to the first electrode and a second conductive growth from the second electrode too the third electrode layer;
a row address decoder for selecting a row of memory cells corresponding to a row address;
a column address decoder for selecting a column of memory cells corresponding to a column address;
reading and writing circuitry coupled to the memory array to read data from and write data to the memory cells selected by the row and column address decoders;
a data path coupled between the reading and writing circuitry and an external data terminal of the memory device; and
a command decoder operable to generate control signals responsive to memory commands applied to the memory device.

30. The memory device of claim 29 wherein the first voltage is positive relative to the second voltage.

31. The memory device of claim 29 wherein the first portion is positioned below the third electrode, and the third electrode is positioned below the second portion.

32. The memory device of claim 29 wherein the first portion is positioned laterally adjacent to the third electrode, and the third electrode is positioned laterally adjacent to the second portion.

33. The memory device of claim 29 wherein the first thickness is less than the second thickness.

34. The memory device of claim 29 wherein under the application of the programming voltage, the first conductive growth couples the third electrode to the first electrode prior to the second conductive growth coupling the second electrode to the third electrode.

* * * * *

UNITED STATES PATENT AND TRADEMARK OFFICE
CERTIFICATE OF CORRECTION

PATENT NO. : 6,809,362 B2  
DATED : October 26, 2004  
INVENTOR(S) : Terry L. Gilton Page 1 of 1

It is certified that error appears in the above-identified patent and that said Letters Patent is hereby corrected as shown below:

Title page,
Item [56], References Cited, OTHER PUBLICATIONS,
"Hegab, N.A.; Fadel, M.; Sedeek, K., Memory switching pehnomena in thin films of chalcogenide semiconductors, Vacuum 45 (1994) 459-462." should read
-- Hegab, N.A.; Fadel, M.; Sedeek, K., Memory switching phenomena in thin films of chalcogenide semiconductors, Vacuum 45 (1994) 459-462. --;
"Neale, R.G.; Aseltine, J.A., The application of amorphous meterials to computer memories, IEEE transactions on electron dev. Ed-20 (1973) 195-209." should read
-- Neale, R.G.; Aseltine, J.A., The application of amorphous materials to computer memories, IEEE transactions on electron dev. Ed-20 (1973) 195-209. --;
"Zhang, M.; Mancini, S.; Bresser, W.; Boolchang, P., Variation of glass transition temperature Tg, with average coordination number, <m>, in network glasses: evidence of a threshold behavior in the slope |dTg/d<m>| at the rigidity percolation threshold (<m>=2.4), J. Non-Cryst. Solids 151 (1992) 149-154." should read
-- Zhang, M.; Mancini, S.; Bresser, W.; Boolchand, P., Variation of glass transition temperature Tg, with average coordination number, <m>, in network glasses: evidence of a threshold behavior in the slope |dTg/d<m>| at the rigidity percolation threshold (<m>=2.4), J. Non-Cryst. Solids 151 (1992) 149-154. --.

Signed and Sealed this

Sixth Day of December, 2005

JON W. DUDAS  
*Director of the United States Patent and Trademark Office*